United States Patent
Kim et al.

(10) Patent No.: US 11,782,565 B2
(45) Date of Patent: *Oct. 10, 2023

(54) DISPLAY DEVICE HAVING ONE OR MORE OPAQUE CONDUCTIVE LAYERS AND BLACKENED LAYERS

(71) Applicant: LG Display Co., Ltd., Seoul (KR)

(72) Inventors: Yong-Il Kim, Dangjin-si (KR); Chang-Hyun Song, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/696,751

(22) Filed: Mar. 16, 2022

(65) Prior Publication Data

US 2022/0206641 A1    Jun. 30, 2022

Related U.S. Application Data

(63) Continuation of application No. 17/156,142, filed on Jan. 22, 2021, now Pat. No. 11,301,102, which is a
(Continued)

(30) Foreign Application Priority Data

Oct. 31, 2017    (KR) ........................ 10-2017-0143646

(51) Int. Cl.
*G06F 3/044*    (2006.01)
*G01R 27/26*    (2006.01)
(Continued)

(52) U.S. Cl.
CPC ....... *G06F 3/0446* (2019.05); *G01R 27/2605* (2013.01); *G06F 3/0412* (2013.01);
(Continued)

(58) Field of Classification Search
CPC ...... G06F 3/044; G06F 3/0412; G06F 3/0446; G06F 2203/04111; G06F 2203/04112;
(Continued)

(56) References Cited

U.S. PATENT DOCUMENTS 9,046,952 B2    6/2015    Kim et al.
9,202,780 B2    12/2015    Lee et al.
(Continued)

FOREIGN PATENT DOCUMENTS

CN    103915398 A    7/2014
CN    107450764 A    12/2017
(Continued)

*Primary Examiner* — Adam J Snyder
(74) *Attorney, Agent, or Firm* — Seed IP Law Group LLP

(57) ABSTRACT

Disclosed is a display device having touch sensors which may improve visibility. In the display device, the touch sensors having a multilayer structure including a blackened layer are arranged on an encapsulation assembly arranged to cover light emitting elements, and touch pads having a multilayer structure including a partially transparent conductive layer are arranged on a region of a substrate exposed by the encapsulation assembly. Therefore, the blackened layer may prevent reflection of external light and thus visibility may be improved, and the partially transparent conductive layer may lower sheet resistance of the touch pads and thus contact resistance between the touch pads and a driver integrated circuit may be reduced.

16 Claims, 15 Drawing Sheets

Related U.S. Application Data continuation of application No. 16/175,580, filed on Oct. 30, 2018, now Pat. No. 10,928,964.

(51) Int. Cl.
*G06F 3/041* (2006.01)
*H10K 50/84* (2023.01)
*H10K 50/805* (2023.01)
*H10K 59/38* (2023.01)
*H10K 59/40* (2023.01)

(52) U.S. Cl.
CPC .... *G06F 3/044* (2013.01); *G06F 2203/04111* (2013.01); *G06F 2203/04112* (2013.01); *H10K 50/805* (2023.02); *H10K 50/84* (2023.02); *H10K 59/38* (2023.02); *H10K 59/40* (2023.02)

(58) Field of Classification Search
CPC . G01R 27/2605; H01L 27/332; H01L 27/323; H01L 51/5203; H01L 51/5237; H10K 50/805; H10K 50/84; H10K 59/38; H10K 59/40

See application file for complete search history.

(56) References Cited

U.S. PATENT DOCUMENTS

| | | |
|---|---|---|
| 2012/0257151 A1 | 10/2012 | Teramoto et al. |
| 2014/0061597 A1 | 3/2014 | Choi et al. |
| 2014/0320761 A1 | 10/2014 | Misaki |
| 2015/0009422 A1 | 1/2015 | Tung |
| 2016/0378224 A1* | 12/2016 | Kwon .................. G06F 3/0445 |
| | | 345/174 |
| 2017/0353181 A1 | 12/2017 | Kim et al. |
| 2017/0371453 A1 | 12/2017 | Nakayama et al. |
| 2018/0039360 A1 | 2/2018 | Akimoto et al. |
| 2018/0040672 A1* | 2/2018 | Park ...................... G06F 3/0443 |
| 2018/0053810 A1 | 2/2018 | Jin et al. |
| 2018/0348900 A1 | 12/2018 | Heinrich et al. |

FOREIGN PATENT DOCUMENTS

| | | |
|---|---|---|
| JP | 2016-184683 A | 10/2016 |
| KR | 10-2013-0072635 A | 7/2013 |
| KR | 10-2016-0064385 A | 6/2016 |
| KR | 20160084632 A | 7/2016 |

* cited by examiner

DISPLAY DEVICE HAVING ONE OR MORE OPAQUE CONDUCTIVE LAYERS AND BLACKENED LAYERS

CROSS-REFERENCE TO RELATED APPLICATION(S)

This application is a continuation of U.S. patent application Ser. No. 17/156,142, filed Jan. 22, 2021; which is a continuation of U.S. Pat. No. 10,928,964, issued Feb. 23, 2021; which claims the benefit of Korean Patent Application No. 10-2017-0143646, filed on Oct. 31, 2017, which is hereby incorporated by reference as if fully set forth herein.

BACKGROUND

Technical Field

The present disclosure relates to a display device having touch sensors, and more particularly, to a display device having touch sensors which may improve visibility.

Description of the Related Art

A touchscreen is an input device through which a user command may be input by selecting instructions displayed on a screen of a display device using a human hand or an article. That is, the touchscreen converts a contact position, which directly contacts a human hand or an article, into an electrical signal, and receives instructions selected at the contact position as an input signal. Such a touchscreen may substitute for a separate input device which is connected to the display device and thus operated, such as a keyboard or a mouse, and, thus, the range of use of the touchscreen tends to be gradually extended.

In general, such a touchscreen is attached to a front surface of a display panel, such as a liquid crystal display panel or an organic electroluminescent diode display panel. In this case, a plurality of opaque electrodes included in the touchscreen reflects external light and is thus recognized by a user.

BRIEF SUMMARY

Accordingly, the present disclosure is directed to a display device having touch sensors that substantially obviates one or more problems due to limitations and disadvantages of the related art.

An object of the present disclosure is to provide a display device having touch sensors which may improve visibility.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes touch sensors having a multilayer structure including a blackened layer and arranged on an encapsulation assembly arranged to cover light emitting elements, and touch pads having a multilayer structure including a partially transparent conductive layer and arranged on a region of a substrate exposed by the encapsulation assembly. Therefore, the blackened layer may prevent reflection of external light and thus visibility may be improved, and the partially transparent conductive layer may lower sheet resistance of the touch pads and thus contact resistance between the touch pads and a driver integrated circuit may be reduced.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
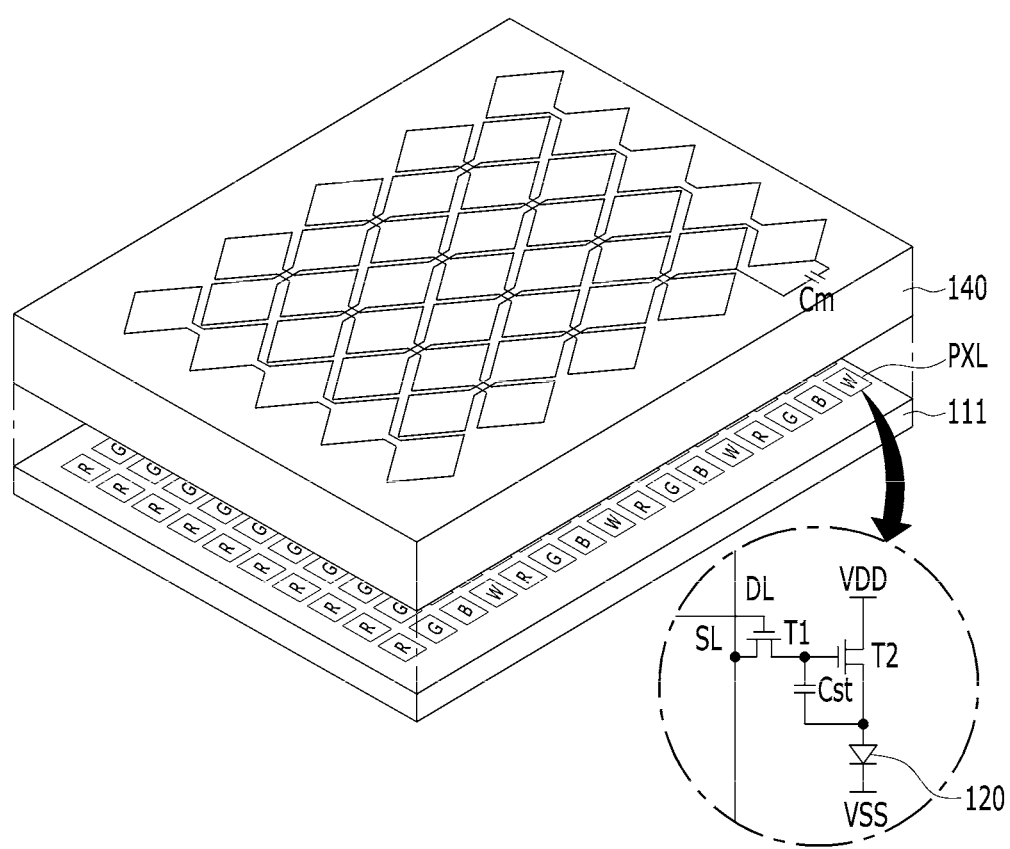
FIG. 1 is a perspective view illustrating an organic light emitting display device having touch sensors in accordance with one embodiment of the present disclosure.
Figure 2:
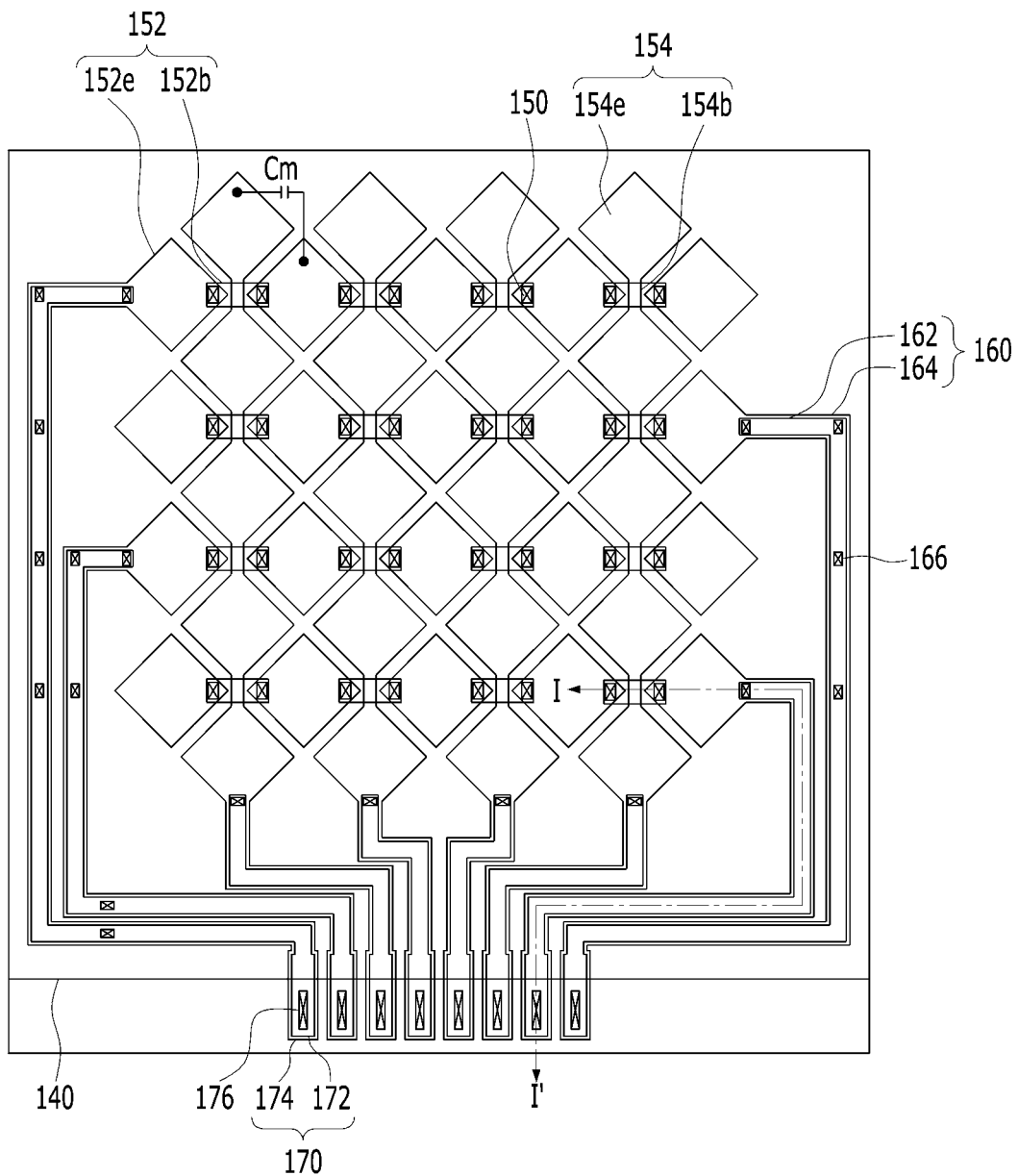
FIG. 2 is a plan view illustrating the organic light emitting display device shown in FIG. 1.
Figure 3:
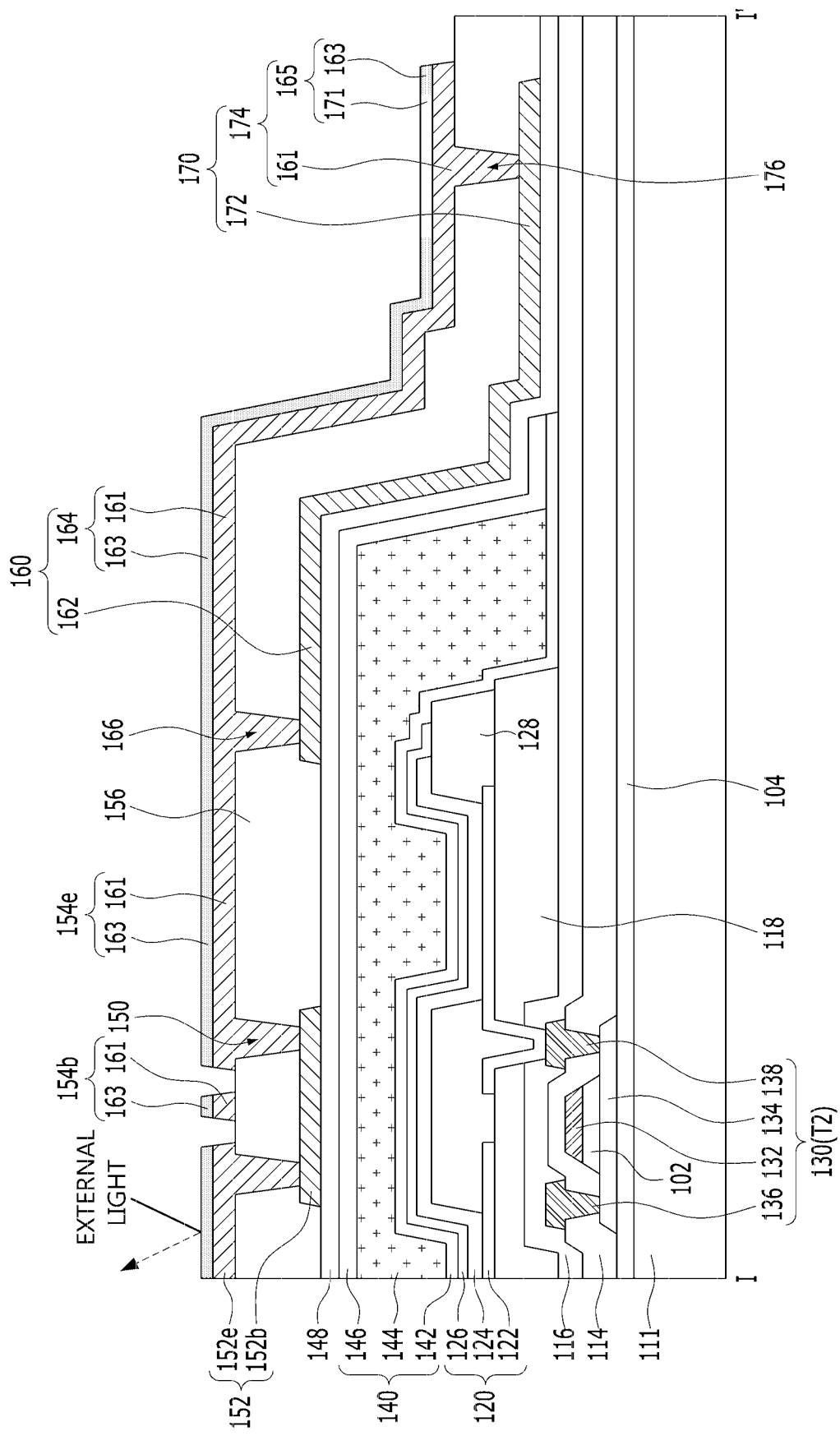
FIG. 3 is a cross-sectional view of the organic light emitting display device shown in FIG. 2, taken along line I-I'.

FIG. 1 is a perspective view illustrating an organic light emitting display device having touch sensors in accordance with one embodiment of the present disclosure, FIG. 2 is a plan view illustrating the organic light emitting display device shown in FIG. 1, and FIG. 3 is a cross-sectional view of the organic light emitting display device shown in FIG. 2, taken along line I-I'.

The organic light emitting display device shown in FIG. 1 senses whether or not user touch occurs and a touch position by sensing change in mutual capacitances Cm (touch sensors) due to the user touch through touch electrodes 152e and 154e shown in FIG. 2 during a touch period. Further, the organic light emitting display shown in FIG. 1 displays an image through unit pixels including light emitting elements 120. The unit pixel includes red (R), green (G) and blue (B) sub-pixels PXL, or includes red (R), green (G), blue (B) and white (W) sub-pixels PXL.

For this purpose, the organic light emitting display shown in FIG. 1 includes a plurality of the sub-pixels PXL arranged in a matrix on a substrate 111 formed of a flexible material or glass, an encapsulation assembly 140 arranged on the sub-pixels PXL, and the mutual capacitances Cm arranged on the encapsulation assembly 140. The encapsulation assembly 140 is comprised of a number of layers, as described herein Each of the sub-pixels PXL includes a pixel driving circuit and the light emitting element 120 connected to the pixel driving circuit.

The pixel driving circuit includes a switching transistor T1, a driving transistor T2 and a storage capacitor Cst. Although this embodiment exemplarily illustrates a structure in which the pixel driving circuit includes two transistors T and one capacitor C, the present disclosure is not limited thereto. That is, a pixel driving circuit having a 3T1C or 3T2C structure including three or more transistors T and one or more capacitors C may be used.

When a scan pulse is supplied to a scan line SL, the switching transistor T1 is turned on and thus supplies a data signal, supplied to a data line DL, to the storage capacitor Cst and a gate electrode of the driving transistor T2.

The driving transistor T2 controls current I supplied from a high voltage (VDD) supply line to the light emitting element 120 in response to the data signal supplied to the gate electrode of the driving transistor T2, thus adjusting the amount of light emitted from the light emitting element 120. Further, even if the switching transistor T1 is turned off, the driving transistor T2 supplies regular current by voltage charging the storage capacitor Cst until a data signal of a next frame is supplied and, thus, the light emitting element 120 maintains light emission.

Such a driving transistor T2 (denoted by 130 in FIG. 3) includes, as exemplarily shown in FIG. 3, a gate electrode 132, an active layer 134, and source and drain electrodes 136 and 138. The gate electrode 132 overlaps the active layer 134 with a gate insulating film 118 disposed therebetween. The source and drain electrodes 136 and 138 are formed on an interlayer insulating film 114 and contact the active layer 134. The active layer 134 is formed of at least one of an amorphous semiconductor material, a polycrystalline semiconductor material or an oxide semiconductor material, on a buffer layer 112. Here, the buffer layer 112 is arranged between the active layer 134 and the substrate 111 and prevents impurities from the substrate 111 from being introduced into the active layer 134. The interlayer insulating film 114 is arranged between the source and drain electrodes 136 and 138 and the gate electrode 132 and thus electrically insulates the source and drain electrodes 136 and 138 and the gate electrode 132 from each other.

The light emitting element 120 includes an anode 122, at least one light emitting stack 124 formed on the anode 122, and a cathode 126 formed on the at least one light emitting stack 124.

The anode 122 is conductively connected to the drain electrode 138 of the driving transistor 130 exposed through a pixel contact hole formed through a protective film 116. Here, the protective film 116 is formed of an inorganic insulating material or an organic insulating between the source and drain electrodes 136 and 138 and the light emitting element 120.

The at least one light emitting stack 124 is formed on the anode 122 in an emission area prepared by a bank 128. The at least one light emitting stack 124 is formed by stacking a hole-related layer, an organic light emitting layer and an electron-related layer on the anode 122 in regular order or in reverse order. Further, the at least one light emitting stack 124 may include first and second light emitting stacks disposed opposite to each other with a charge generation layer CGL disposed therebetween. In this case, an organic light emitting layer of one of the first and second light emitting stacks generates blue light and an organic light emitting layer of the other of the first and second light emitting stacks generates yellow-green light and, thus, white light is generated through the first and second light emitting stacks. White light generated by the at least one light emitting stack 124 is incident upon color filters (not shown) located on or under the at least one light emitting stack 124, thus implementing a color image. Otherwise, without separate color filters, each light emitting stack 124 may generate light corresponding to the color of each sub-pixel, thus implementing a color image. That is, the light emitting stack 124 of a red (R) sub-pixel may generate red light, the light emitting stack 124 of a green (G) sub-pixel may generate green light, and the light emitting stack 124 of a blue (B) sub-pixel may generate blue light.

The cathode 126 is formed opposite to the anode 122 with the at least one light emitting stack 124 disposed therebetween and is connected to a low voltage (VSS) supply line.

The encapsulation assembly 140 prevents external moisture or oxygen from permeating the light emitting elements 120, which are vulnerable to external moisture or oxygen. For this purpose, the encapsulation assembly 140 includes a plurality of inorganic encapsulation layers 142 and 146 and an organic encapsulation layer 144 arranged between the inorganic encapsulation layers 142 and 146, and the inorganic encapsulation layer 146 is arranged as the uppermost layer. Here, the encapsulation assembly 140 includes at least two inorganic encapsulation layers 142 and 146 and at least one organic encapsulation layer 144. In the present disclosure, a structure of the encapsulation assembly 140, in which the organic encapsulation layer 144 is arranged between the first and second inorganic encapsulation layers 142 and 146, will be exemplarily described.

The first inorganic encapsulation layer 142 is formed on the substrate 111 provided with the cathode 126 formed thereon so as to be located adjacent to the light emitting element 120. Such a first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Since the first inorganic encapsulation layer 142 is deposited in a low-temperature atmosphere, damage to the light emitting stack 124, which is vulnerable to a high-temperature atmosphere, during a deposition process of the first inorganic encapsulation layer 142, may be prevented.

The organic encapsulation layer 144 serves as a buffer to reduce stress between respective layers according to bending of the organic light emitting display device and strengthens planarization performance of the organic light emitting display device. The organic encapsulation layer 144 is formed of an organic insulating material, such as acrylic resin, epoxy resin, polyimide, polyethylene or silicon oxycarbide (SiOC).

The second inorganic encapsulation layer 146 is formed to cover the upper and side surfaces of the organic encapsulation layer 144 and the upper surface of the first inorganic encapsulation layer 142 exposed by the organic encapsulation layer 144. Thereby, the second inorganic encapsulation layer 146 minimizes and prevents permeation of external moisture or oxygen into the first inorganic encapsulation layer 142 and the organic encapsulation layer 144. The second inorganic encapsulation layer 146 is formed of an inorganic insulating material, such as silicon nitride ($SiN_x$), silicon oxide ($SiO_x$), silicon oxynitride (SiON) or aluminum oxide ($Al_2O_3$).

A touch buffer film 148 is arranged on the encapsulation assembly 140. The touch buffer film 148 is formed between touch sensing lines 154 and touch driving lines 152 and the light emitting element 120 and maintains a distance of at least 5 μm between each of the touch sensing lines 154 and the touch driving lines 152 and the cathode 126. Therefore, a capacitance value of a parasitic capacitor formed between each of the touch sensing lines 154 and the touch driving lines 152 and the cathode 126 may be minimized and, thus, mutual influence between each of the touch sensing lines 154 and the touch driving lines 152 and the cathode 126 due to coupling therebetween may be prevented. If the distance between each of the touch sensing lines 154 and the touch driving lines 152 and the cathode 126 is less than 5 μm, touch performance is lowered by mutual influence between each of the touch sensing lines 154 and the touch driving lines 152 and the cathode 126 due to coupling therebetween.

Further, the touch buffer film 148 may prevent a liquid chemical (a developing solution or an etching solution) used during a manufacturing process of the touch sensing lines 154 and the touch driving lines 152 or external moisture from permeating the organic light emitting layer. Therefore, the touch buffer film 148 may prevent damage to the organic light emitting layer which is vulnerable to a liquid chemical or moisture.

In order to prevent damage to the organic light emitting layer which is vulnerable to a high temperature, the touch buffer film 148 is formed of an organic or inorganic insulating material which may be formed at a low temperature of 100° C. or lower and having low permittivity of 1-3. For example, the touch buffer film 148 may be formed of an acrylic-based material, an epoxy-based material or a siloxane-based material. The touch buffer film 148 formed of an organic insulating material may prevent damage to the respective encapsulation layers 142, 144 and 146 of the encapsulation assembly 140 and breakage of the touch sensing lines 154 and the touch driving lines 152 formed on the touch buffer film 148 according to bending of the organic light emitting display device.

The touch sensing lines 154 and the touch driving lines 152 are arranged on the touch buffer film 148 so as to intersect each other with a touch insulating film 156 disposed therebetween. The mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

The term "intersect" is used herein in its broadest sense to include within the meaning that one element crosses over or overlaps another element, and does not necessarily require that the two elements contact each other. For example, the touch sensing lines 154 and the touch driving lines 152 may overlap, and thus intersect with each other, but may be physically separated from one another, for example, by one or more layers or elements provided there between. It also includes within its meaning, in some embodiments that the lines or elements can contact each other.

The touch driving line 152 includes a plurality of first touch electrodes 152e and first bridges 152b to conductively connect the first touch electrodes 152e.

The first touch electrodes 152e are spaced apart from each other at regular intervals in a first direction, i.e., the X-axis direction, on the touch insulating film 156. Each of the first touch electrodes 152e is conductively connected to the adjacent first touch electrode 152e through the first bridge 152b.

The first bridges 152b are arranged on the touch buffer film 148, exposed through touch contact holes 150 formed through the touch insulating film 156, and conductively connected to the first touch electrodes 152e. The first bridges 152b are arranged so as to overlap the bank 128 and, thus, lowering of an aperture ratio due to the first bridges 152b may be prevented.

The touch sensing line 154 includes a plurality of second touch electrodes 154e and second bridges 154b to conductively connect the second touch electrodes 154e.

The second touch electrodes 154e are spaced apart from each other at regular intervals in a second direction, i.e., in the Y-axis direction, on the touch insulating film 156. Each of the second touch electrodes 154e is conductively connected to the adjacent second touch electrode 154e through the second bridge 154b.

The second bridges 154b are arranged on the touch insulating film 156 so as to be coplanar with the second touch electrodes 154e, and are conductively connected to the second touch electrodes 154e without separate contact holes.

The second bridges 154b are arranged so as to overlap the bank 128 and, thus, lowering of an aperture ratio due to the second bridges 154b may be prevented. Although this embodiment exemplarily illustrates the second bridges 154b as being connected to the second touch electrodes 154e without contact holes, the second bridges 154b may be connected to the second touch electrodes 154e through the touch contact holes 150 and the first bridges 152b may be connected to the first touch electrodes 152e without contact holes. In this case, the second bridges are arranged on the encapsulation assembly 140 or the touch buffer film 148, and the first bridges 152b are arranged on the touch insulating film 156.

The touch driving lines 152 and the touch sensing lines 154 including the touch electrodes 152e and 154e and the bridges 152b and 154b are connected to a touch driving assembly (not shown) through routing lines 160 and touch pads 170 arranged in a non-active (bezel) area.

The routing lines 160 transmit a touch driving pulse generated by the touch driving assembly to the tough driving lines 152 through the touch pads 170, and transmit a touch signal from the touch sensing lines 154 to the touch pads 170.

The routing lines 160 are arranged between the first and second touch electrodes 152e and 154e and the touch pads 170 so as to be connected to the first and second touch electrodes 152e and 154e and the touch pads 170. The routing lines 160 connected to the first touch electrodes 152e are extended towards at least one of the left or right side of the active area and are connected to the touch pads 170, as exemplarily shown in FIG. 2. The routing lines 160 connected to the second touch electrodes 154e are extended towards at least one of the upper or lower side of the active area and are connected to the touch pads 170. Arrangement of the routing lines 160 is not limited to the structure of FIG. 2 and may be variously changed according to design specifications of the display device.

The routing lines 160 contact the side surface of the touch buffer film 148 or the encapsulation assembly 140 so as to cover the side surface of the encapsulation assembly 140, as exemplarily shown in FIG. 3. The routing lines 160 may be formed to have a multilayer structure, as exemplarily shown in FIG. 3, or be formed to have a monolayer structure, as exemplarily shown in FIGS. 4A and 4B.

The routing lines 160 having a multilayer structure shown in FIG. 3 include first routing lines 162 formed of the same material as or a different material from the first bridges 152*b*, and second routing lines 164 formed of the same material as the second bridges 154*b*. The second routing lines 164 extend from the first and second touch electrodes 152*e* and 154*a* and are connected to the first routing lines 162 exposed through routing contact holes 166 formed through the touch insulating film 156. In this case, the routing lines 160 have a multilayer structure and, thus, resistance of the routing lines 160 may be reduced. Further, even if disconnection of one of the first and second routing lines 162 and 164 occurs, a touch driving pulse and a touch signal may be transmitted through the remaining routing lines and, thus, reliability may be improved.

Figure 4A:
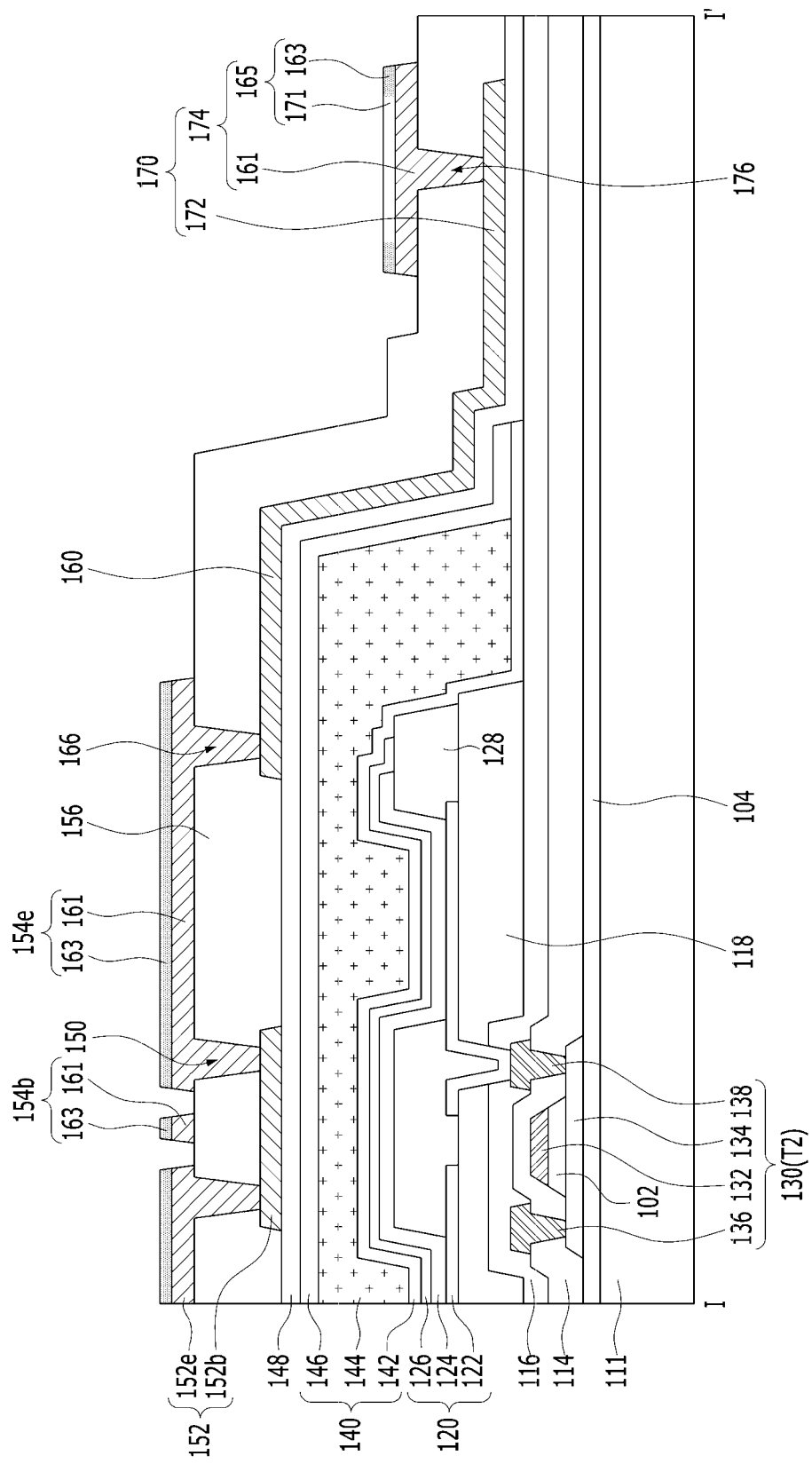
FIG. 4A is a cross-sectional view illustrating another embodiment of a routing line shown in FIG. 3.
Figure 4B:
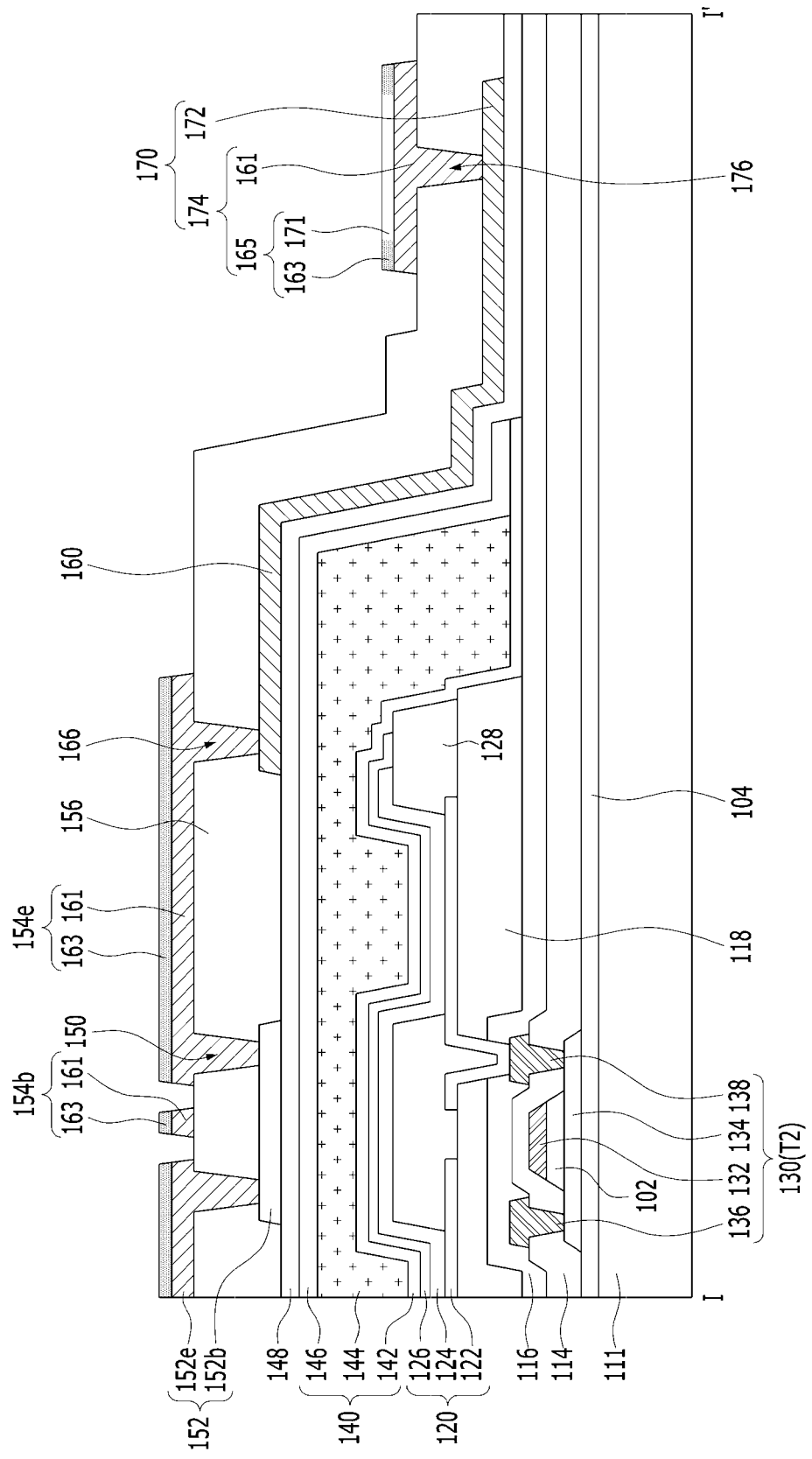
FIG. 4B is a cross-sectional view illustrating another embodiment of a first bridge shown in FIG. 3.

The routing lines 160 shown in FIG. 4A are formed of the same material as the first bridges 152*b* and arranged on the encapsulation assembly 140, and the routing lines 160 shown in FIG. 4B are formed of a different material from the first bridges 152*b* and arranged on the encapsulation assembly 140. For example, the routing lines 160 and the first bridges 152*b* shown in FIG. 4A and the routing lines 160 shown in FIG. 4B may be formed to have a monolayer or multilayer structure using at least one material having excellent conductivity selected from the group consisting of Ti, Al, Mo, MoTi, Cu and Ta. Further, the first bridges 152*b* shown in FIG. 4B may be formed of a transparent conductive layer, such as indium-tin-oxide (ITO) or indium-zinc-oxide (IZO). The routing lines 160 are exposed through routing contact holes 166 formed through the touch insulating film 156 and connected to the first and second touch electrodes 152*e* and 154*e*.

The touch pads 170 are formed to be exposed to the outside and are thus connected to a signal transmission film on which the touch driving assembly (not shown) is mounted. The touch pads 170 and display pads, connected to at least one of a data line DL, a scan line SL, the low voltage (VSS) supply line or the high voltage (VDD) supply line, may be arranged in at least one of one side region or the other side region of the non-active area of the substrate 111, or the touch pads 170 and the display pads may be arranged in different regions of the non-active area. The touch pads 170 are not limited to the structure of FIG. 2 and may be variously changed according to design specifications of the display device.

The touch pads 170 are arranged on the upper surface of the substrate 111 exposed by the encapsulation assembly 140. That is, the touch pads 170 are arranged on at least one insulating film selected from the group consisting of a buffer layer 104, the interlayer insulating film 114 and the protective film 116, which are arranged between the substrate 111 and the encapsulation assembly 140, or on the touch buffer film 148. Each of the touch pads 170 includes a touch pad electrode 172 and a pad cover electrode 174 arranged on the touch pad electrode 172.

The touch pad electrodes 172 are formed through the same mask process as the first routing lines 162 using the same material as the first routing lines 162. Since the touch pad electrodes 172 extend from the first routing lines 162 on the touch buffer film 148 or the protective film 116, the touch pad electrodes 172 are directly connected to the first routing lines 162.

The pad cover electrodes 174 are formed through the same mask process as the touch electrodes 152*e* and 154*e* using the same material as the touch electrodes 152*e* and 154*e*. The pad cover electrodes 174 are conductively connected to the touch pad electrodes 172 exposed through pad connect holes 176 formed through the touch insulating film 156.

Each of the first and second touch electrodes 152*e* and 154*e*, the second bridges 154*b* and the second routing lines 164 of the present disclosure includes an opaque conductive layer 161 and a blackened layer 163.

The opaque conductive layer 161 is formed to have a monolayer or multilayer structure using at least one material having high corrosion resistance and acid resistance and higher conductivity than the blackened layer 163, selected from the group consisting of Ti, Al, Mo, MoTi, Cu and Ta. For example, the opaque conductive layer 161 may be formed to have a bi-layer structure, such as Al/Ti, Cu/MoTi or Al/Mo.

The opaque conductive layer 161 under the blackened layer 163 directly contacts the blackened layer 163. Such an opaque conductive layer 161 reduces resistance of the blackened layer 163 and, thus, conductivity of the first and second touch electrodes 152*e* and 154*e* and the second bridges 154*b* may be secured and touch sensitivity may be maintained.

The blackened layer 163 is formed on the opaque conductive layer 161 so as to have the same line width as the opaque conductive layer 161 and thus to cover the entirety of the upper surface of the opaque conductive layer 161. The blackened layer 163 is formed by blackening a transparent conductive layer, such as indium-tin-oxide (ITO) or indium-zinc-oxide (IZO). The blackened layer 163 has light absorbance and thus has lower light reflectivity than the opaque conductive layer 161 and lower light transmissivity than the transparent conductive layer. In this case, the blackened layer 163 reduces the amount of external light incident upon the opaque conductive layer 161 of each of the first and second touch electrodes 152*e* and 154*e* and the second bridges 154*b* and the amount of light reflected by the opaque conductive layer 161. Therefore, reflectivity of the opaque transparent layer 161 of each of the first and second touch electrodes 152*e* and 154*e*, the second bridges 154*b* and the second routing lines 164 may be lowered and, thus, the first and second touch electrodes 152*e* and 154*e*, the second bridges 154*b* and the second routing liens 164 may be prevented from being seen due to external light.

Figure 5A:
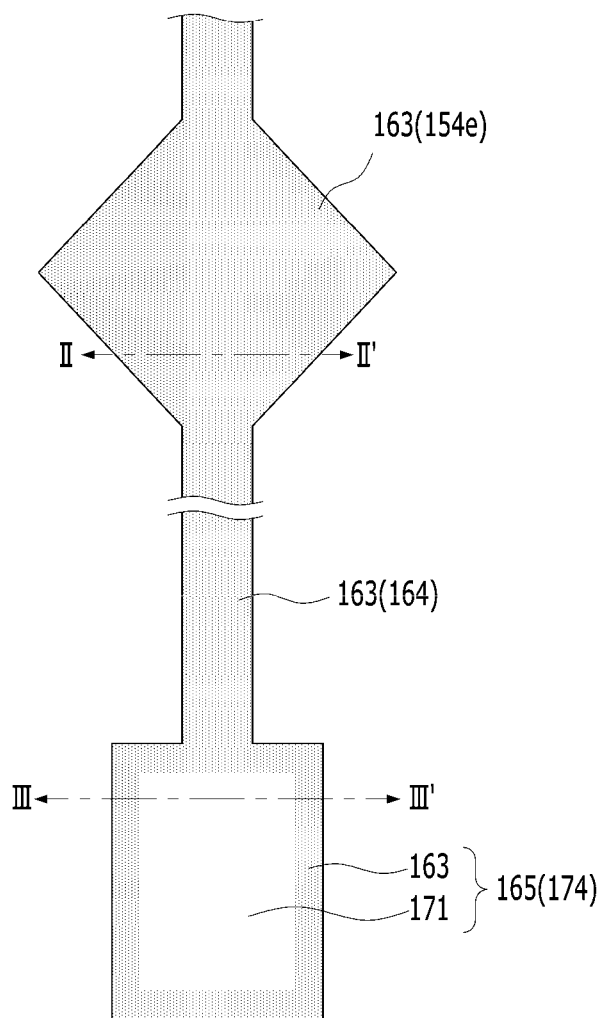
FIGS. 5A and 5B are plan and cross-sectional views illustrating a second touch electrode and a pad cover electrode shown in FIGS. 2 and 3.
Figure 5B:
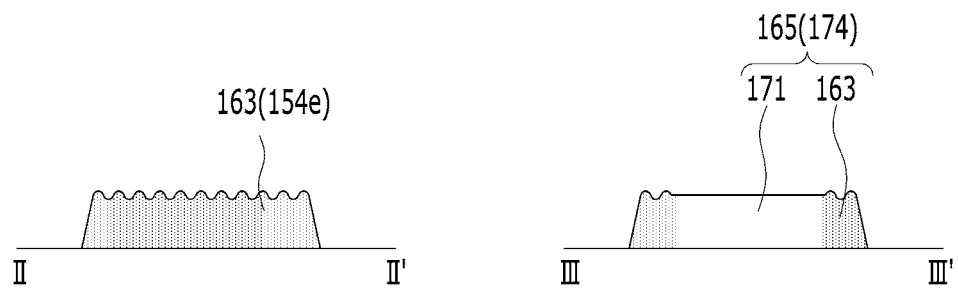

Further, the blackened layer 163 in some embodiments, has an uneven surface having a convex and concave structure, as exemplarily shown in FIGS. 5A and 5B. The uppermost surface of the blackened layer 163 is corrugated in one embodiment. The corrugated upper surface provides a number of benefits to assist the blackened layer 163 to have less light reflectivity that the opaque layer 161. Since external light is scattered by the convex and concave structure of the blackened layer 163, a user either does not recognize the touch electrodes or recognizes the first and second touch electrodes 152*e* and 154*e* and the second bridges 154*b* only blurredly and, thus, recognition of the first and second touch electrodes 152*e* and 154*e* and the second bridges 154*b* by the user may be reduced. Further, each of the pad cover electrodes 174 in accordance with the present disclosure includes an opaque conductive layer 161 and a partially transparent conductive layer 165 arranged on the opaque conductive layer 161.

The opaque conductive layer 161 of the pad cover electrode 174 is formed of the same material as the opaque conductive layer 161 of each of the first and second touch electrodes 152e and 154e and the second bridges 154b.

The partially transparent conductive layer 165 includes a transparent conductive layer 171 and a blackened layer 163, which are arranged on the opaque conductive layer 161.

The blackened layer 163 is arranged on the opaque conductive layer 161 so as to be coplanar with the transparent conductive layer 171. The blackened layer 163 is arranged on the edge area of the opaque conductive layer 161 so as to surround the transparent conductive layer 171.

Figure 6:
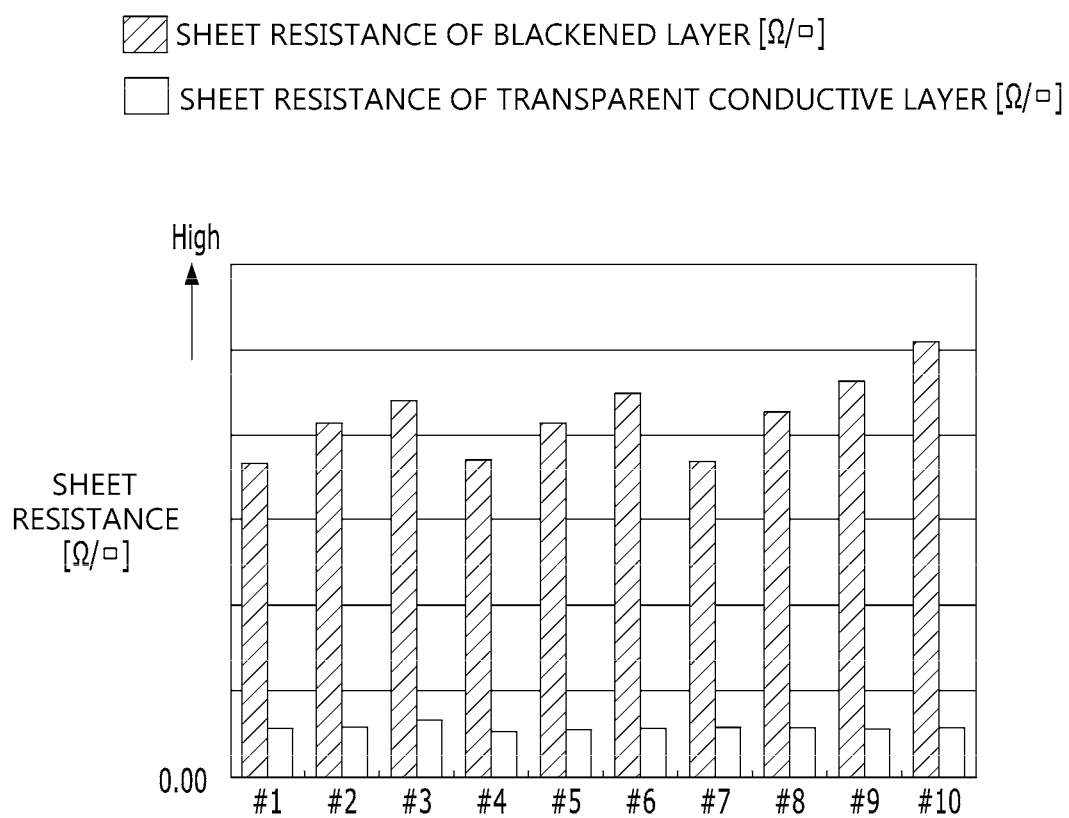
FIG. 6 is a graph representing sheet resistances of a transparent conductive layer and a blackened layer of the pad cover electrode shown in FIG. 3.

The transparent conductive layer 171 having a smaller area than that of the opaque conductive layer 161 is arranged on the opaque conductive layer 161. The transparent conductive layer 171 is formed of a material having lower sheet resistance than that of the blackened layer 163, i.e., a material including indium and oxygen, such as ITO, IZO or IGZO, as exemplarily shown in FIG. 6. Since the transparent conductive layer 171 has a larger area than that of the blackened layer 163, the transparent conductive layer 171 reduces resistance of the blackened layer 163 and, thus, conductivity of the pad cover electrode 174 may be secured.

As such, in the pad cover electrode 170, the partially transparent conductive layer 165 including the transparent conductive layer 171 having high corrosion resistance and acid resistance is arranged as the uppermost layer. The partially transparent conductive layer 165 contacts a driver integrated circuit. When the partially transparent conductive layer 165 contacts the driver integrated circuit, the transparent conductive layer 171 having lower sheet resistance than that of the blackened layer 163 may prevent increase in contact resistance.

FIGS. 7A to 7F are cross-sectional views illustrating a method of manufacturing the organic light emitting display device shown in FIG. 3.

First, a conductive layer is deposited on the whole surface of the substrate 111 provided with the switching transistors T1, the driving transistors 130 (T2), the light emitting elements 120, the encapsulation assembly 140 and the touch buffer layer 148 formed thereon, through a deposition process. Thereafter, the conductive layer is patterned through a photolithography process and an etching process, thus forming the first bridges 152b, the first routing lines 162 and the touch pad electrodes 172, as exemplarily shown in FIG. 7A.

Figure 7A:
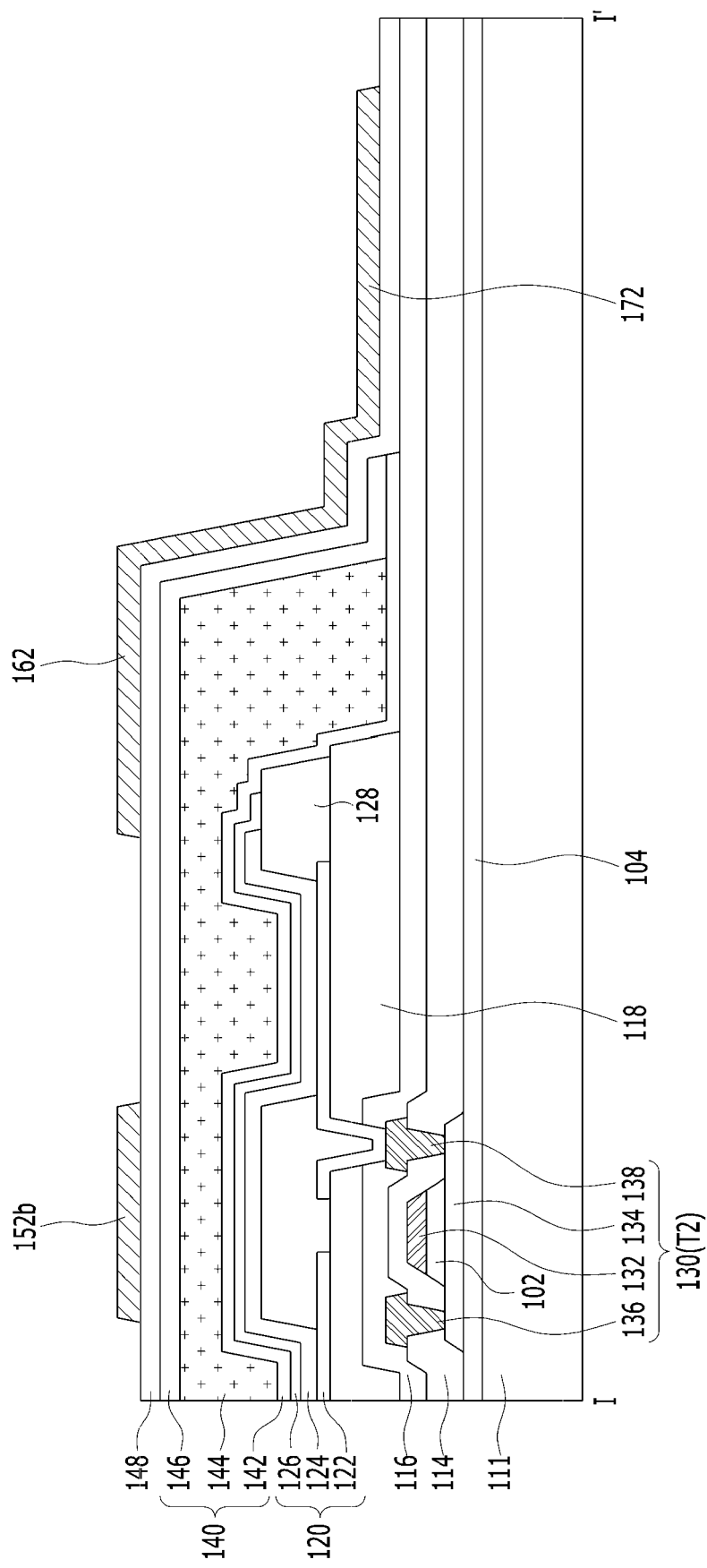
FIGS. 7A to 7F are cross-sectional views illustrating a method of manufacturing the organic light emitting display device shown in FIG. 3.
Figure 7B:
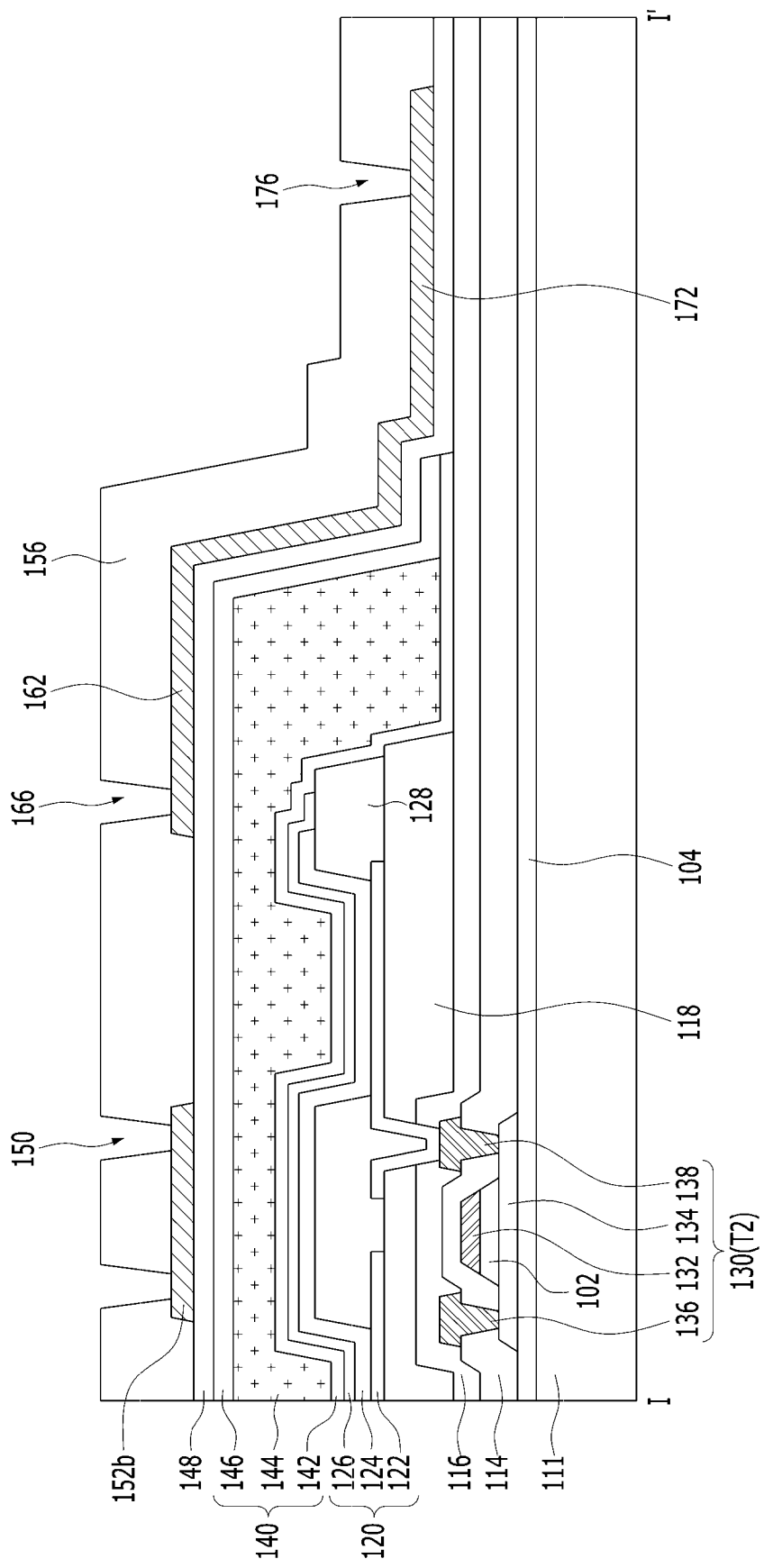

Thereafter, at least one of an inorganic insulating material or an organic insulating material is deposited on the substrate 111 provided with the first bridges 152b, the first routing lines 162 and the touch pad electrodes 172 formed thereon, thus forming the touch insulating film 156, as exemplarily shown in FIG. 7B. Here, as the touch insulating film 156, an inorganic film, such as $SiN_x$, SiON or $SiO_x$, or an organic film, such as an acrylic-based organic film, an epoxy-based organic film, Parylene-C, Parylene-N, Parylene-F or a siloxane-based organic film, may be used. Thereafter, the touch insulating film 156 is patterned through a photolithography process and an etching process, thus forming the touch contact holes 150, the routing contact holes 166 and the pad contact holes 176.

Figure 7C:
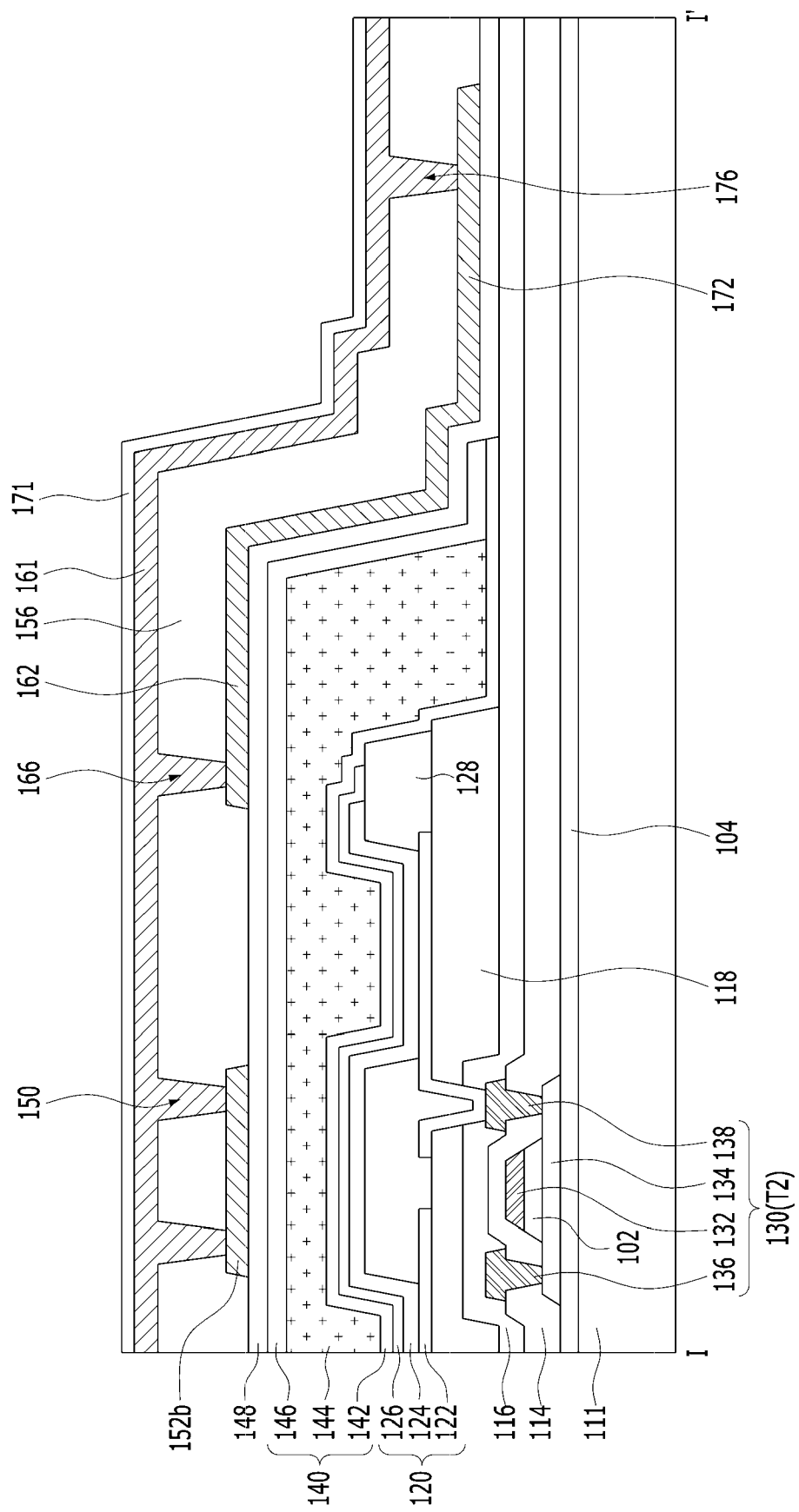

Thereafter, the opaque conductive layer 161 and the transparent conductive layer 171 are sequentially deposited on the touch insulating film 156 provided with the touch contact holes 150, the routing contact holes 166 and the pad contact holes 176, as exemplarily shown in FIG. 7C. Here, the transparent conductive layer 171 is formed using a material including indium and oxygen, such as ITO, IZO or IGZO, and the opaque conductive layer 161 is formed to have a monolayer or multilayer structure using a material having high corrosion resistance and acid resistance and excellent conductivity, such as Al, Ti, Cu or Mo.

Figure 7D:
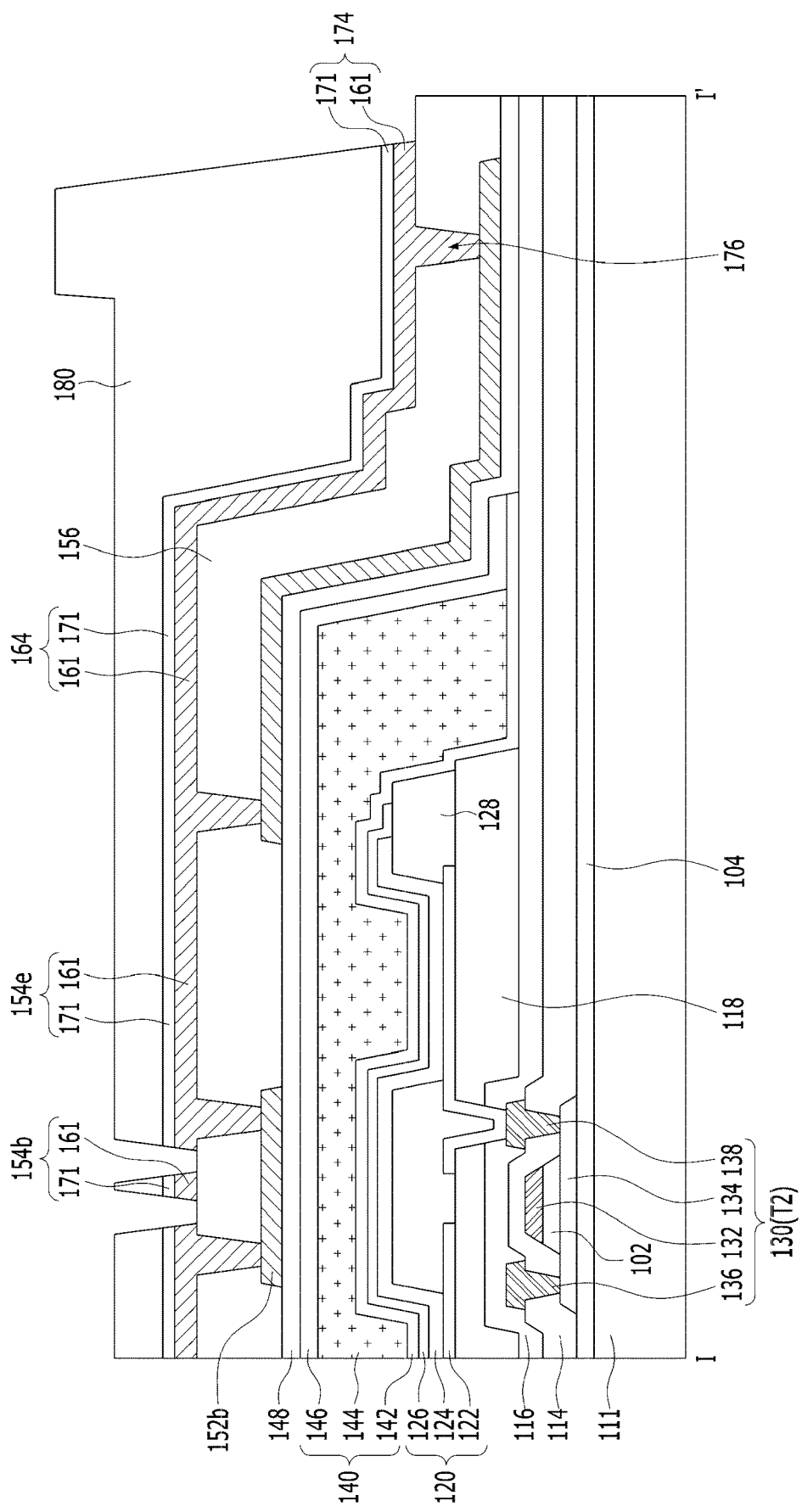

Thereafter, a photoresist pattern 180 having a multi-step structure is formed on the transparent conductive layer 171 through a photolithography process, as exemplarily shown in FIG. 7D. The photoresist pattern 180 having the multi-step structure is formed to have a second thickness in a region in which the pad cover electrodes 174 will be formed, and a first thickness smaller than the second thickness in a region in which the first and second touch electrodes 152e and 154e, the second bridges 154b and the second routing lines 164 will be formed, and is not formed in the remaining regions.

The opaque conductive layer 161 and the transparent conductive layer 171 are patterned through an etching process using the photoresist pattern 180 having such a multi-step structure as a mask, thus forming the first and second touch electrodes 152e and 154e, the second bridges 154b, the second routing lines 164, and the pad cover electrodes 174.

Figure 7E:
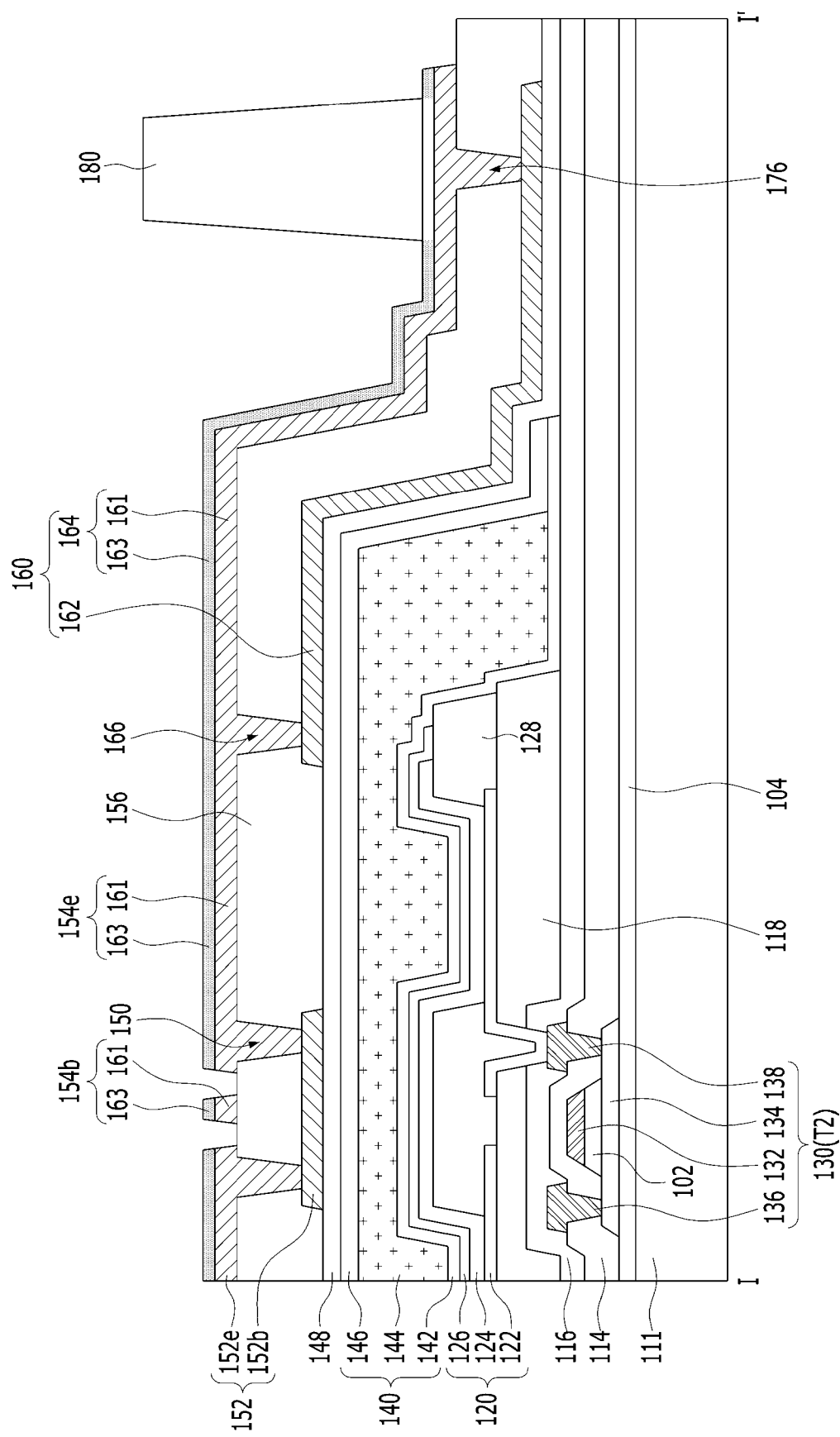

Thereafter, the overall thickness of the photoresist pattern 180 is reduced through ashing of the photoresist pattern 180 having the multi-step structure and, thus, the photoresist pattern 180 having the first thickness is removed, as exemplarily shown in FIG. 7E. Thereby, the entire upper surface of the transparent conductive layer 171 of the first and second touch electrodes 152e and 154e, the second bridges 154b and the second routing lines 164 is exposed, and the edge of the upper surface of the transparent conductive layer 171 of the pad cover electrodes 174 is exposed. Thereafter, the exposed entire upper surface of the transparent conductive layer 171 of the first and second touch electrodes 152e and 154e, the second bridges 154b and the second routing lines 164, and the exposed part of the upper surface of the transparent conductive layer 171 of the pad cover electrodes 174 are blackened using the ashed photoresist pattern 180 as a mask, thus forming the blackened layer 163.

In more detail, the exposed entire upper surface of the transparent conductive layer 171 of the first and second touch electrodes 152e and 154e, the second bridges 154b and the second routing lines 164, and the exposed part of the upper surface of the transparent conductive layer 171 of the pad cover electrodes 174 are treated with hydrogen ($H_2$) plasma. In this case, $O^-$ ions included in the transparent conductive layer 171 and H radicals of hydrogen ($H_2$) react with each other and thus reduction of the transparent conductive layer 171, in which oxygen is removed from the transparent conductive layer, occurs. Therefore, the concentration of oxygen included in the transparent conductive layer 171 is lowered, crystallinity of the transparent conductive layer 171 is deteriorated and, thus, transmissivity of the transparent conductive layer 171 is lowered and the transparent conductive layer 171 is blackened, thereby forming the blackened layer 163. During blackening, indium is precipitated on the surface of the blackened layer 163 and surface morphology of the blackened layer 163 is increased and, therefore, the surface of the blackened layer 163 is formed to have a convex and concave structure.

Thereby, the blackened layer 163 is formed on the opaque conductive layer 161 of the first and second touch electrodes 152e and 154e and the second bridges 152b and the second routing lines 160 so as to cover the entire upper surface of the opaque conductive layer 161. Further, the transparent conductive layer 171 and the blackened layer 163 surrounding the transparent conductive layer 171 are formed on the opaque conductive layer 161 of the pad cover electrodes 174.

Figure 7F:
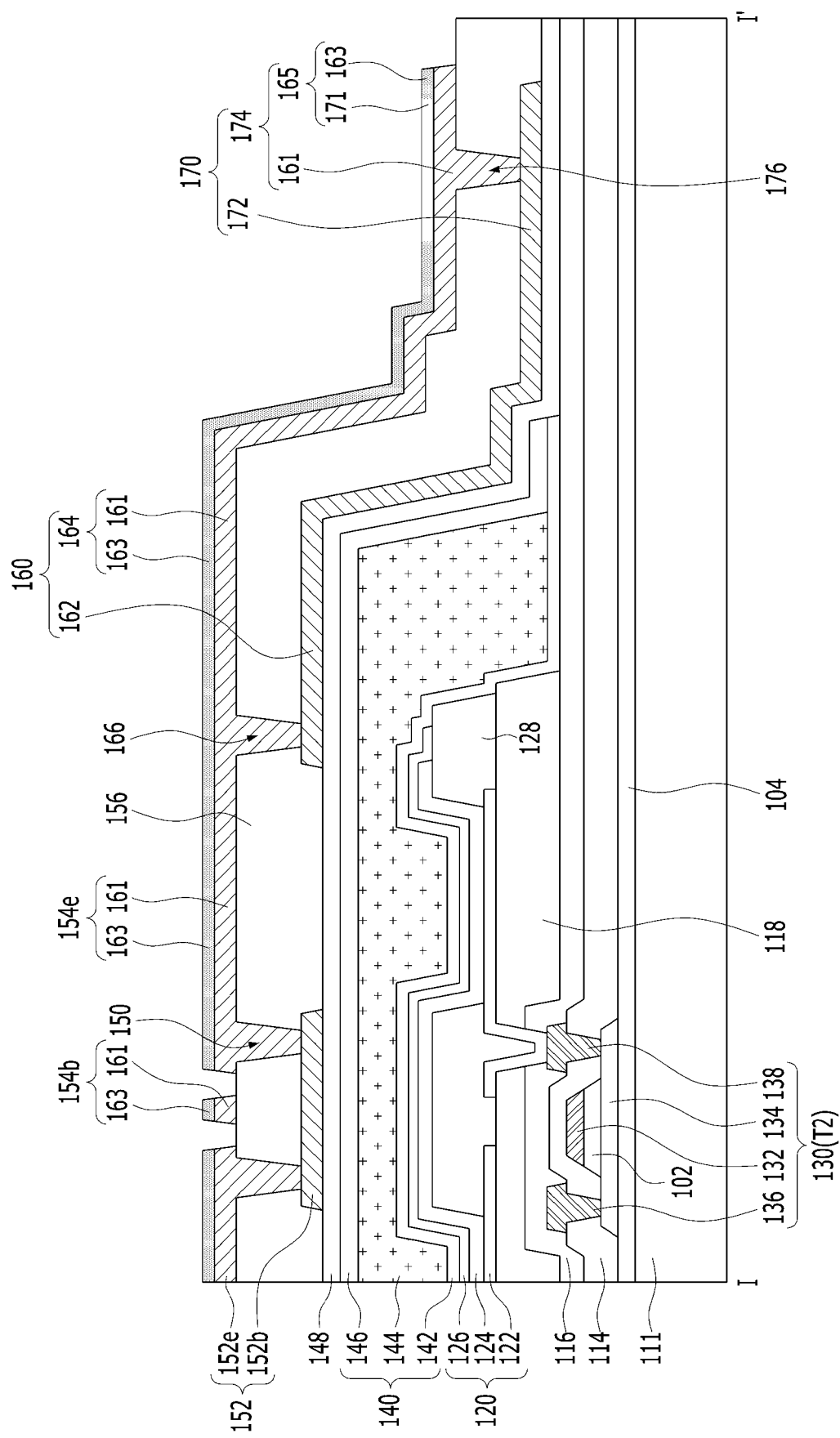

Thereafter, the photoresist pattern 180 remaining on the substrate 111 is removed through a stripping process, as exemplarily shown in FIG. 7F.

As such, the blackening layer 163 is arranged as the uppermost layer of the first and second touch electrodes 152e and 154e and the second bridges 154b. Thereby, the blackened layer 163 prevents reflection of external light without application of a high-priced low reflectivity metal and thus visibility may be improved. Further, the partially transparent conductive layer 165 is arranged as the uppermost layer of the touch pads 170. Therefore, sheet resistance of the touch pads 170 may be lowered and, thus, contact resistance between the touch pads 170 and the driver integrated circuit may be reduced.

Figure 8:
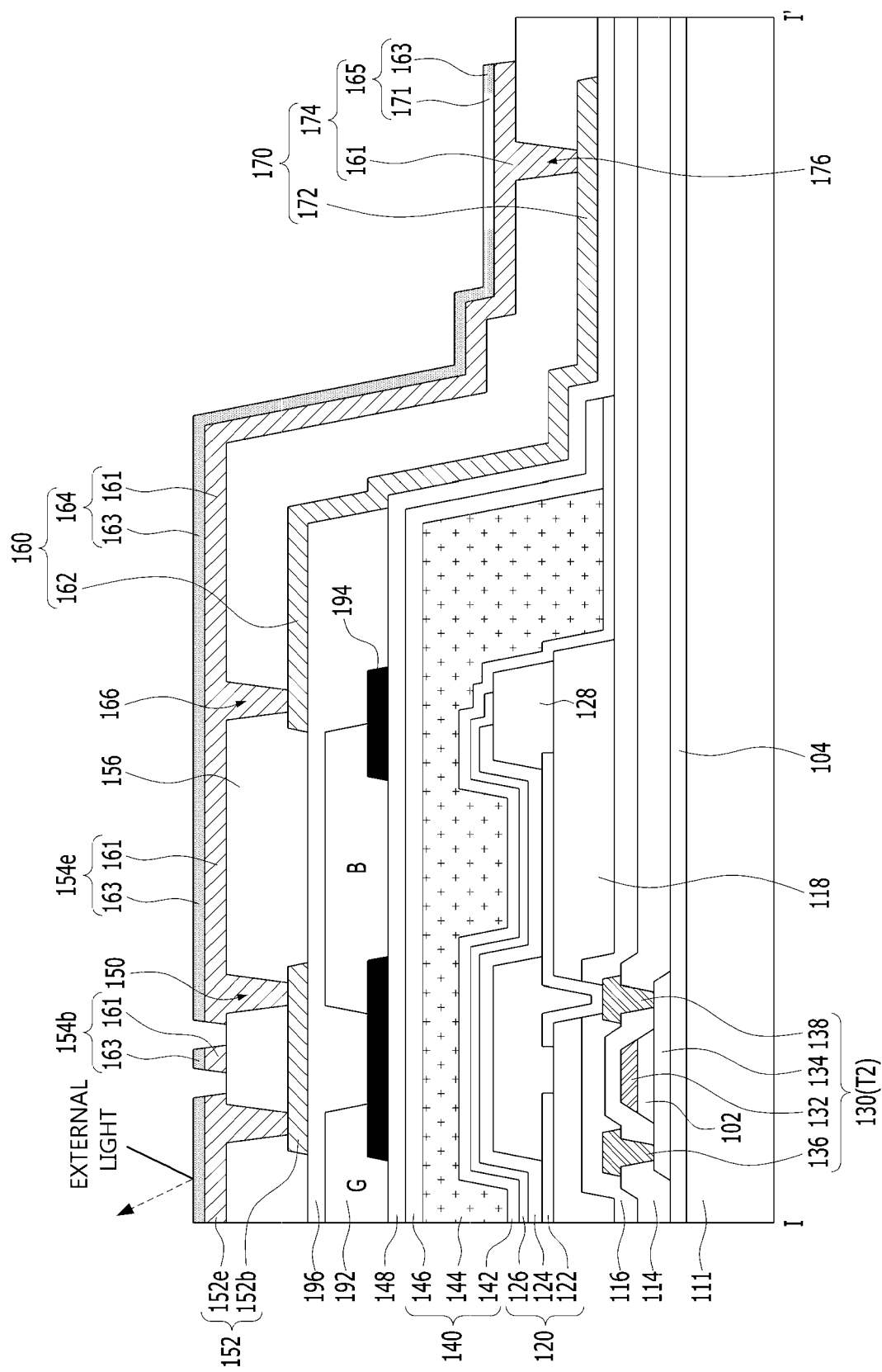
FIG. 8 is a cross-sectional view illustrating an organic light emitting display device having touch sensors in accordance with another embodiment of the present disclosure.

FIG. 8 is a cross-sectional view illustrating an organic light emitting display device in accordance with another embodiment of the present disclosure.

The organic light emitting display device in accordance with this embodiment shown in FIG. 8 includes the same elements as the organic light emitting display device in accordance with the earlier embodiment shown in FIG. 3 except that color filters 192 arranged between an encapsulation assembly 140 and touch electrodes 152e and 154e are further provided. Therefore, a detail description of the elements of the organic light emitting display device in accordance with this embodiment, which are the same as those of the organic light emitting display device in accordance with the earlier embodiment, will be omitted.

The color filter 192 is formed between each of touch sensing lines 154 and touch driving lines 152 and a light emitting element 120. A distance between each of the touch sensing lines 154 and the touch driving lines 152 and the light emitting element 120 is increased by the color filter 192. Therefore, a capacitance value of a parasitic capacitor formed between each of the touch sensing lines 154 and the touch driving lines 152 and the light emitting element 120 may be minimized and, thus, mutual influence between each of the touch sensing lines 154 and the touch driving lines 152 and the light emitting element 120 due to coupling therebetween may be prevented. Further, the color filters 192 may prevent a liquid chemical (a developing solution or an etching solution) used during a manufacturing process of the touch sensing lines 154 and the touch driving lines 152 or external moisture from permeating a light emitting stack 124. Therefore, the color filters 192 prevent damage to the light emitting stack 124 which is vulnerable to a liquid chemical or moisture. Further, although FIG. 8 exemplarily illustrates that the touch electrodes 152e and 154e are arranged on the color filters 192, the color filters 192 may be arranged on the touch electrodes 152e and 154e. In this case, the touch electrodes 152e and 154e are arranged between the color filters 192 and the encapsulation assembly 140.

A black matrix 194 is arranged between the color filters 192. The black matrix 194 serves to divide respective sub-pixel regions from each other and to prevent light leakage and optical coherence between neighboring sub-pixel regions. The black matrix 194 is formed of a black insulating material having high resistance, or is formed by stacking at least two color filters selected from the group consisting of red (R), green (G) and blue (B) color filters. Further, a touch planarization film 196 is formed on the substrate 111 provided with the color filters 192 and the black matrix 194 formed thereon. The touch planarization film 196 serves to flatten the substrate 111 provided with the color filters 192 and the black matrix 194 formed thereon.

Figure 9A:
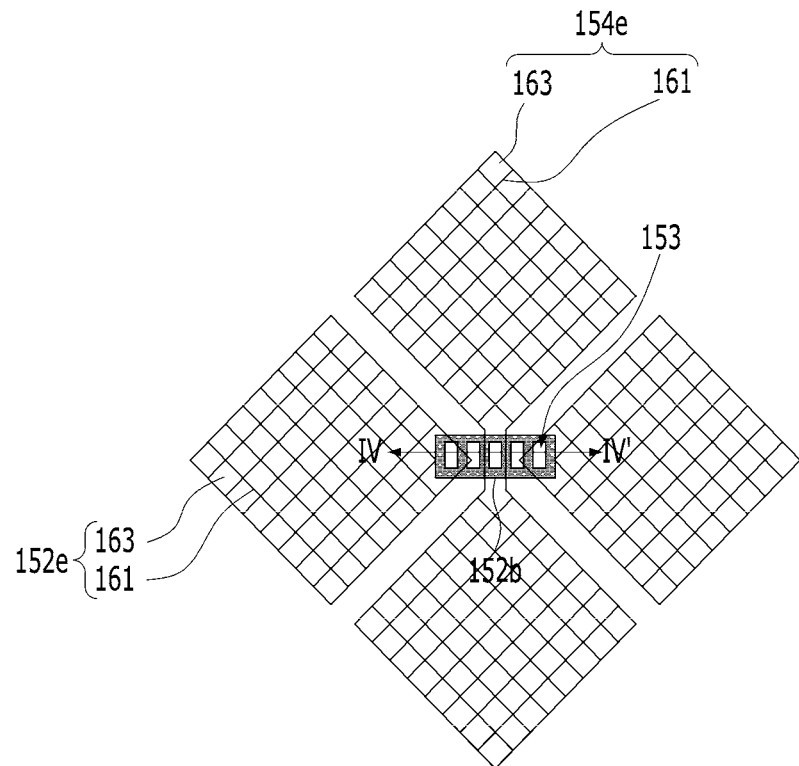
FIGS. 9A and 9B are plan and cross-sectional views illustrating another type of bridges of an organic light emitting display device having touch sensors in accordance with the present disclosure.
Figure 9B:
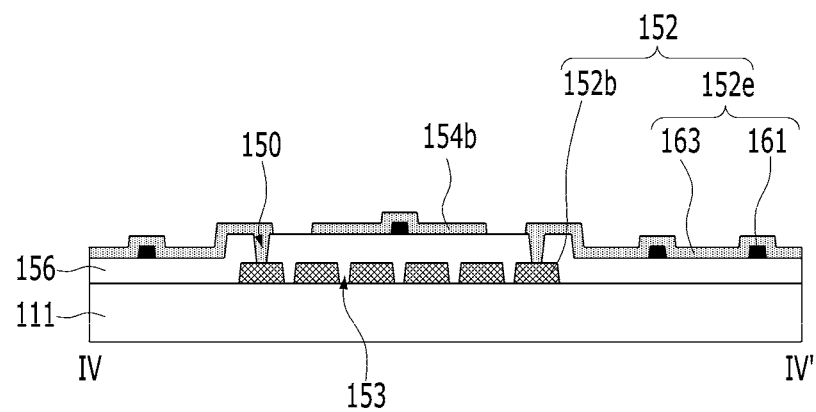

At least one of the first bridges 152b or the second bridges 154b in accordance with the present disclosure may include a plurality of slits 153, as exemplarily shown in FIGS. 9A and 9B. The first bridge 152b including the slits 153 shown in FIGS. 9A and 9B may have a reduced area, as compared to the first bridge 152b including no slits shown in FIG. 3. Therefore, reflection of external light by the first bridges 152b may be reduced and, thus, lowering of visibility may be prevented.

Further, although the present disclosure exemplarily describes a structure in which each of the first and second touch electrodes 152e and 154e and the second bridges 154b includes the opaque conductive layer 161 and the blackened layer 163, the opaque transparent layer 161 having a smaller area than that of the blackened layer 163 may be formed as a mesh, or the blackened layer 163 and the opaque transparent layer 161 may be formed as a mesh.

As apparent from the above description, in an organic light emitting display device having touch sensors in accordance with the present disclosure, a blackening layer is arranged as the uppermost layer of each of first and second touch electrodes and second bridges having a multilayer structure. Therefore, the blackened layer may prevent reflection of external light without application of a high-priced low reflectivity metal and thus visibility may be improved. Further, a partially transparent conductive layer is arranged as the uppermost layer of touch pads having a multilayer structure. Therefore, sheet resistance of the touch pads may be lowered and, thus, contact resistance between the touch pads and a driver integrated circuit may be reduced. Moreover, while a touchscreen is attached to a conventional organic light emitting display device through an adhesive, touch electrodes are arranged on an encapsulation assembly of the organic light emitting display device in accordance with the present disclosure without a separate attachment process and, thus, process simplification and cost reduction may be achieved.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
light emitting elements arranged on a substrate;
an encapsulation assembly arranged on the light emitting elements;
touch sensors having a multilayer structure arranged on the encapsulation assembly, the touch sensors including a first opaque conductive layer and a first blackened layer on an upper surface of the first opaque conductive layer; and
touch pads including a touch pad electrode arranged on a region of the substrate on which the encapsulation assembly is not disposed, and a pad cover electrode arranged on the touch pad electrode to overlap the touch pad electrode with a touch insulating film interposed therebetween,
wherein the pad cover electrode includes:
a second opaque conductive layer arranged on the touch pad electrode with the touch insulating film interposed therebetween, and
a second blackened layer having an area smaller than an area of the second opaque conductive layer and directly contacting with an upper surface of the second opaque conductive layer,
wherein the second opaque conductive layer has higher conductivity than the second blackened layer.

2. The display device according to claim 1, wherein:
the pad cover electrode further includes a transparent conductive layer arranged on the second opaque conductive layer, the transparent conductive layer overlaps with the touch pad electrode,
the second blackened layer is positioned on both sides of the transparent conductive layer, and
the transparent conductive layer is in direct contact with the upper surface of the opaque conductive layer.

3. The display device according to claim 2, wherein the touch pads further include:
a contact hole below the second opaque conductive layer, wherein the pad cover electrode is electrically connected to the touch pad electrode through the contact hole of the touch insulating film.

4. The display device according to claim 3, wherein the transparent conductive layer is positioned over the contact hole.

5. The display device according to claim 2, wherein the second blackened layer is arranged on the second opaque conductive layer so as to surround the transparent conductive layer.

6. The display device according to claim 2, wherein the first blackened layer is arranged at uppermost parts of the touch sensors, and the transparent conductive layer is arranged at uppermost parts of the touch pads.

7. The display device according to claim 2, wherein each of the first and second blackened layers has lower light reflectivity than the first and second opaque conductive layers and lower light transmissivity than the transparent conductive layer.

8. The display device according to claim 2, wherein each of the first and second blackened layers has an uneven surface having a convex and concave structure.

9. The display device according to claim 2, wherein each of an uppermost surface of the first and second blackened layers is corrugated.

10. The display device according to claim 2, wherein the second blackened layer is arranged on the second opaque conductive layer so as to at least partially surround the transparent conductive layer.

11. The display device according to claim 1, further including:
routing lines configured to electrically connect the touch sensors to the touch pads and disposed along a side surface of the encapsulation assembly.

12. The display device according to claim 11, wherein the touch pad electrode extends from one of the routing lines, and directly contacts with one of the routing lines.

13. The display device according to claim 1, further comprising color filters arranged between the encapsulation assembly and the touch sensors.

14. The display device according to claim 1, further comprising color filters arranged on the touch sensors,
wherein the touch sensors are arranged between the color filters and the encapsulation assembly.

15. A display device comprising:
light emitting elements arranged on a substrate;
an encapsulation assembly arranged on the light emitting elements;
touch sensors having a multilayer structure arranged on the encapsulation assembly, the touch sensors including a blackened layer on an upper surface of the touch sensors;
touch pads including a touch pad electrode arranged on a region of the substrate on which the encapsulation assembly is not disposed; and
a pad cover electrode arranged on the touch pad electrode to overlap the touch pad electrode with a touch insulating film interposed therebetween,
wherein the touch sensors include touch sensing lines and touch driving lines arranged on the encapsulation assembly so as to overlap each other,
wherein at least one of the touch sensing lines includes:
first touch electrodes arranged in a first direction on the encapsulation assembly; and
first bridges configured to electrically connect the first touch electrodes,
wherein at least one of the touch driving lines includes:
second touch electrodes arranged in a second direction overlapping the first direction; and
second bridges arranged so as to overlap the first bridges with the touch insulating film disposed therebetween, and configured to electrically connect the second touch electrodes,
wherein each of the first and second touch electrodes and the second bridges includes:
at least one opaque conductive layer arranged on the touch insulating film; and
the blackened layer having substantially a same line width as the at least one opaque conductive layer and arranged on the at least one opaque conductive layer, and
wherein the pad cover electrode includes an opaque conductive layer and a substantially transparent conductive layer arranged on the at least one opaque conductive layer, the substantially transparent conductive layer overlaps with the touch pad electrode,
the substantially transparent conductive layer includes a transparent region and blackened regions positioned on both sides of the transparent region, and
the transparent region and the blackened regions are in contact with the upper surface of the opaque conductive layer.

16. A display device comprising:
light emitting elements arranged on a substrate;
an encapsulation assembly arranged on the light emitting elements;

touch sensors having a multilayer structure arranged on the encapsulation assembly, the touch sensors including a blackened layer on an upper surface of the touch sensors;

touch pads including a touch pad electrode arranged on a region of the substrate on which the encapsulation assembly is not disposed; and a pad cover electrode arranged on the touch pad electrode to overlap the touch pad electrode with a touch insulating film interposed therebetween, wherein the touch sensors include touch sensing lines and touch driving lines arranged on the encapsulation assembly so as to overlap each other, wherein at least one of the touch sensing lines includes:
   first touch electrodes arranged in a first direction on the encapsulation assembly; and
   first bridges configured to electrically connect the first touch electrodes, wherein at least one of the touch driving lines includes:
   second touch electrodes arranged in a second direction overlapping the first direction; and
   second bridges arranged so as to overlap the first bridges with the touch insulating film disposed therebetween, and configured to electrically connect the second touch electrodes, wherein each of the first and second touch electrodes and the second bridges includes:
   at least one opaque conductive layer arranged on the touch insulating film; and
   the blackened layer having substantially a same line width as the at least one opaque conductive layer and arranged on the at least one opaque conductive layer, and wherein the pad cover electrode includes an opaque conductive layer and a substantially transparent conductive layer arranged on the at least one opaque conductive layer, the substantially transparent conductive layer overlaps with the touch pad electrode, the substantially transparent conductive layer includes a transparent region and blackened regions positioned on both sides of the transparent region, the transparent region and the blackened regions are in contact with the upper surface of the opaque conductive layer, and wherein each of the blackened layer and the blackened regions has lower light reflectivity than the opaque conductive layer and lower light transmissivity than the substantially transparent conductive layer.

\* \* \* \* \*